United States Patent
Zhou (10) Patent No.: US 9,958,698 B2
(45) Date of Patent: May 1, 2018

(54) 3D DISPLALY PANEL AND 3D DISPLAY DEVICE

(71) Applicant: Shenzhen China Star Optoelectronics Technology Co., Ltd., Shenzhen, Guangdong (CN)

(72) Inventor: Kaifeng Zhou, Guangdong (CN)

(73) Assignee: Shenzhen China Star Optoelectronics Co., Ltd, Shenzhen, Guangdong (CN)

( * ) Notice: Subject to any disclaimer, the term of this patent is extended or adjusted under 35 U.S.C. 154(b) by 198 days.

(21) Appl. No.: 15/100,408

(22) PCT Filed: Apr. 22, 2016

(86) PCT No.: PCT/CN2016/080001
§ 371 (c)(1),
(2) Date: May 31, 2016

(87) PCT Pub. No.: WO2017/161622
PCT Pub. Date: Sep. 28, 2017

(65) Prior Publication Data
US 2018/0095289 A1 Apr. 5, 2018

(30) Foreign Application Priority Data
Mar. 24, 2016 (CN) .......................... 2016 1 0176216

(51) Int. Cl.
*H01L 51/52* (2006.01)
*H01L 27/32* (2006.01)
(Continued)

(52) U.S. Cl.
CPC ............ *G02B 27/26* (2013.01); *H01L 27/326* (2013.01); *H01L 27/3262* (2013.01);
(Continued)

(58) Field of Classification Search
CPC . G02B 27/26; H01L 51/5293; H01L 27/3262; H01L 27/326
See application file for complete search history.

(56) References Cited

U.S. PATENT DOCUMENTS

| 8,654,159 B2* | 2/2014 | Hwang | .................. G02B 27/26 345/694 |
| 2014/0002776 A1* | 1/2014 | Kim | ..................... G02B 5/3083 349/106 |
| 2015/0084018 A1* | 3/2015 | Zhou | ................... H01L 27/3211 257/40 |

FOREIGN PATENT DOCUMENTS

| CN | 101196615 A | 6/2008 |
| CN | 102213838 A | 10/2011 |

(Continued)

*Primary Examiner* — Benjamin Sandvik
*Assistant Examiner* — Gustavo Ramallo
(74) *Attorney, Agent, or Firm* — Andrew C. Cheng (57) ABSTRACT

Disclosed are a 3D display panel and the 3D display device. The 3D display panel includes a base plate, a plurality of pixel units, and first and second light emission units. Each of the pixel units includes at least one the sub-pixel, which includes primary and secondary pixel respectively corresponding to the first and second light emission units. Each of the two light emission units includes an anode, a hole transportation layer, an orientation layer, a light emissive layer, an electron transportation layer, and a cathode that are sequentially stacked. In the first and second light emission units, the orientation layers set the orientations of the light emissive layers to first and second orientation states, respectively, and first and second electrons and first and second holes respectively generated by the cathodes and anodes are recombined in the light emissive layers to respectively emit first and polarization light, which are orthogonal.

18 Claims, 7 Drawing Sheets

(51) Int. Cl.
*G02B 27/26* (2006.01)
*H01L 51/50* (2006.01)
*H01L 51/00* (2006.01)

(52) U.S. Cl.
CPC ...... *H01L 51/5293* (2013.01); *H01L 51/0035* (2013.01); *H01L 51/0037* (2013.01); *H01L 51/0076* (2013.01); *H01L 51/5012* (2013.01); *H01L 51/5056* (2013.01); *H01L 51/5072* (2013.01); *H01L 51/5206* (2013.01); *H01L 51/5221* (2013.01); *H01L 51/5234* (2013.01)

(56) References Cited

FOREIGN PATENT DOCUMENTS

| CN | 103353673 A | 10/2013 |
|---|---|---|
| CN | 104081261 A | 10/2014 |

\* cited by examiner

3D DISPLALY PANEL AND 3D DISPLAY DEVICE

CROSS REFERENCE TO RELATED APPLICATIONS

This application claims the priority of Chinese Patent Application No. 201610176216.2 filed on Mar. 24, 2016, titled "3D Display Panel and 3D Display Device", the disclosure of which is incorporated herein by reference in its entirety.

BACKGROUND OF THE INVENTION

1. Field of the Invention

The present invention relates to the field of display, and more particularly to a 3D display panel and a 3D display device.

2. The Related Arts

Three-dimensional (3D) display techniques provide a person with the perception of three-dimensional space by utilizing binocular visual effect of the left and right eyes of the person, of which the primary principle is that the left eye and the right eye of an observer respectively receive different images and pupil distance between the two eyes of the observer generates a positional difference so that two images between which "binocular parallax" is present may constitute a "stereoscopic image pair". The "stereoscopic image pair", after being analyzed and combined by the brain, allows the left eye and the right eye of the observer to perceive stereopsis. The 3D display techniques that are currently used can be classified as bare-eye 3D display techniques and spectacle 3D display techniques. Spectacle 3D display techniques are a hot spot of 3D displaying.

SUMMARY OF THE INVENTION

The present invention provides a 3D display panel. The 3D display panel comprises: a base plate and a plurality of pixel units formed on the base plate and arranged in an array. Each of the pixel units comprises at least one sub-pixel. Each of the sub-pixels comprises a primary pixel and a secondary pixel. The 3D display panel further comprises a first light emission unit and a second light emission unit that are arranged on the same side of the base plate and respectively correspond to the primary pixel and the secondary pixel. The first light emission unit is controlled by a first thin-film transistor, and the second light emission unit is controlled by a second thin-film transistor. The first light emission unit comprises a first anode, a first hole transportation layer, a first orientation layer, a first light emissive layer, a first electron transportation layer, and a first cathode that are arranged on the same side of the base plate and sequentially stacked. The first cathode supplies first holes, and the first hole transportation layer transports the first holes to the first light emissive layer. The first orientation layer sets orientation of the first light emissive layer so that the first light emissive layer is in a first orientation state. The first cathode supplies first electrons, and the first electron transportation layer transports the first electrons to the first light emissive layer. The first electrons and the first holes are recombined in the first light emissive layer to emit first polarization light. The second light emission unit comprises a second anode, a second hole transportation layer, a second orientation layer, a second light emissive layer, a second electron transportation layer, and a second cathode that are arranged on the same side of the base plate and sequentially stacked. The second anode supplies the second holes, and the second hole transportation layer transports the second holes to the second light emissive layer. The second orientation layer sets orientation of the second light emissive layer so that the second light emissive layer is in a second orientation state. The second cathode supplies second electrons, and the second electron transportation layer transports the second electrons to the second light emissive layer. The second electrons and the second holes are recombined in the second light emissive layer to emit second polarization light. The polarization of the first polarization light are orthogonal to the polarization of the second polarization light.

In the above 3D display panel, the first light emission unit and the second light emission unit satisfy at least one of the following conditions:

the first anode and the second anode being arranged on the same layer;

the first hole transportation layer and the second hole transportation layer being arranged on the same layer;

the first orientation layer and the second orientation layer being arranged on the same layer;

the first light emissive layer and the second light emissive layer being arranged on the same layer;

the first electron transportation layer and the second electron transportation layer being arranged on the same layer; and the first cathode and the second cathode being arranged on the same layer.

In the above 3D display panel, the first light emission unit and the second light emission unit satisfy at least one of the following conditions:

the first anode and the second anode being arranged as a unitary structure, when the first anode and the second anode are arranged on the same layer;

the first hole transportation layer and the second hole transportation layer being arranged as a unitary structure, when the first hole transportation layer and the second hole transportation layer are arranged on the same layer;

the first orientation layer and the second orientation layer being arranged as a unitary structure, when the first orientation layer and the second orientation layer are arranged on the same layer;

the first light emissive layer and the second light emissive layer being arranged as a unitary structure, when the first light emissive layer and the second light emissive layer are arranged on the same layer;

the first electron transportation layer and the second electron transportation layer being arranged on the same layer, when the first electron transportation layer and the second electron transportation layer are arranged on the same layer; and the first cathode and the second cathode being arranged as a unitary structure, when the first cathode and the second cathode are arranged on the same layer.

In the above 3D display panel, the base plate is provided on a surface of the first anode that is distant from the first hole transportation layer and is also provided on a surface of the second anode that is distant from the second hole transportation layer.

In the above 3D display panel, the first anode and the second anode are transparent electrodes and the first cathode and the second cathode are metal electrodes; and the first polarization light and the second polarization light are projected out from a surface of the base plate that is distant from the first anode and the second anode.

In the above 3D display panel, the base plate is provided on a surface of the first cathode that is distant from the first electron transportation layer and is provided on a surface of the second cathode that is distant from the second electron transportation layer.

In the above 3D display panel, the first cathode and the second cathode are transparent electrodes and the first anode and the second anode are metal electrodes; and the first polarization light and the second polarization light are projected out from a surface of the base plate that is distant from the first cathode and the second cathode.

In the above 3D display panel, the first light emissive layer and the second light emissive layer comprise organic liquid crystal polymer.

In the above 3D display panel, the first orientation layer comprises one of PEDOT:PSS, PPV, and PANI; and the second orientation layer comprises one of PEDOT:PSS, PPV, and PANI.

The present invention also provides a 3D display device, and the 3D display device comprises the above described 3D display panel.

Compared to the prior art, the present invention provides a 3D display panel, in which each sub-pixel is divided into a primary pixel and a secondary pixel and a first light emission unit that is provided to correspond to the primary pixel and a second light emission unit that is provided to correspond to the secondary pixel divide a display image into first polarization light and second polarization light of which polarizations are orthogonal, which, when used in combination with goggles that are capable of receiving the two types of polarization light, allow a left eye and a right eye to respectively receive different images, allowing human eyes to form, through observation and combination of the images, a stereoscopic image.

BRIEF DESCRIPTION OF THE DRAWINGS

To more clearly explain the technical solution proposed in an embodiment of the present invention and that of the prior art, a brief description of the drawings that are necessary for describing embodiments is given as follows. It is obvious that the drawings that will be described below show only some embodiments. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution of embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 3:
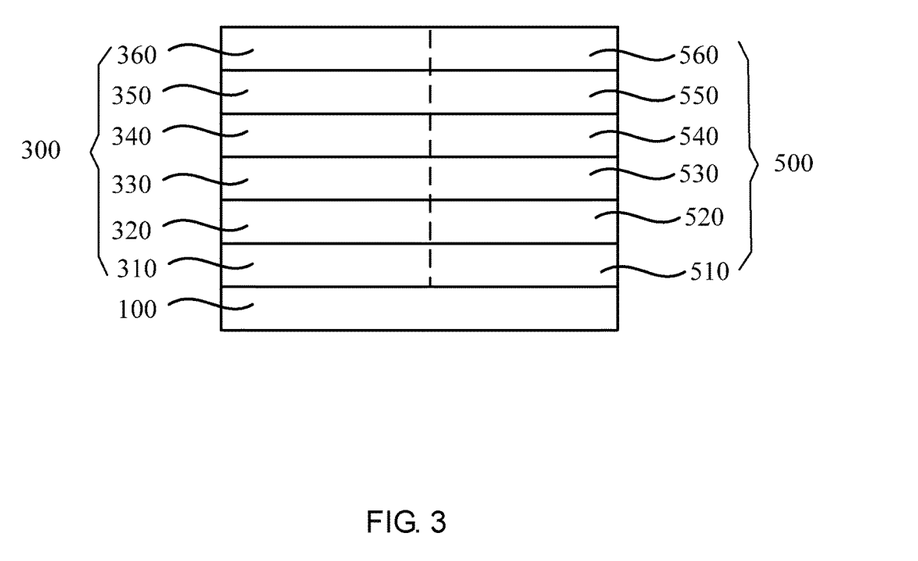
FIG. 3 is a cross-sectional view taken along line II-II of FIG. 2.
Figure 4:
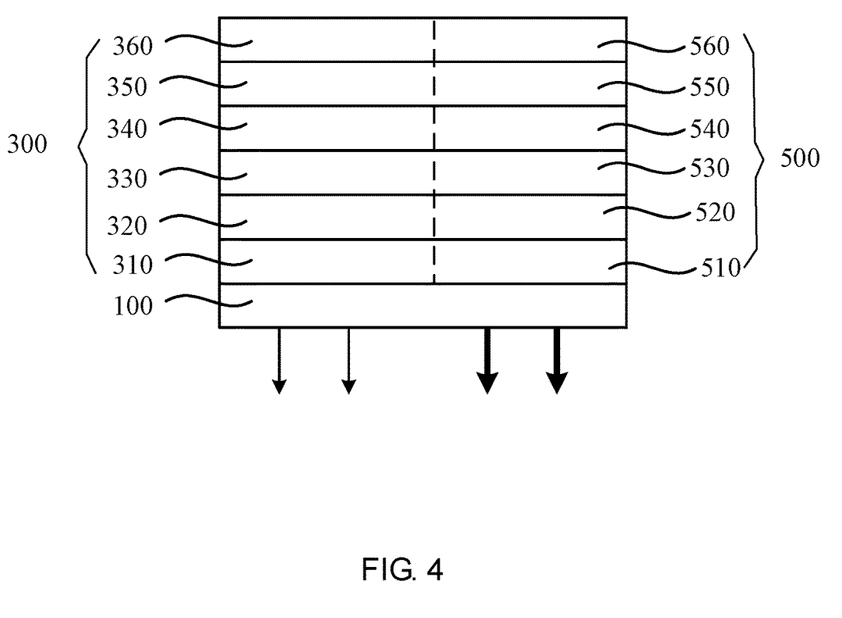
FIG. 4 is a schematic view illustrating first polarization light and second polarization light respectively emitting from a first light emission unit and a second light emission unit respectively corresponding to a primary pixel and a secondary pixel of the sub-pixel of FIG. 2.
Figure 5:
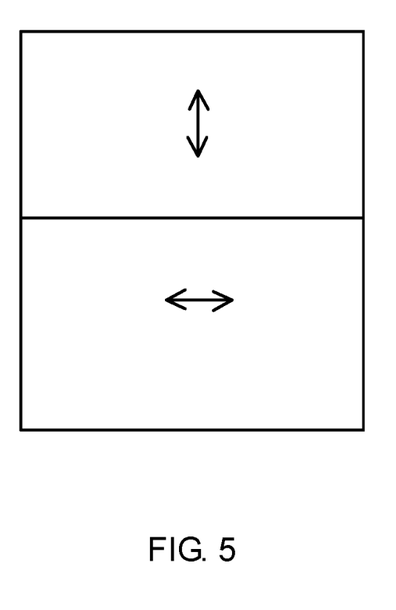
FIG. 5 is a schematic view illustrating, as a top view, angles of the first polarization light and the second polarization light of the sub-pixel of FIG. 3.
Figure 6:
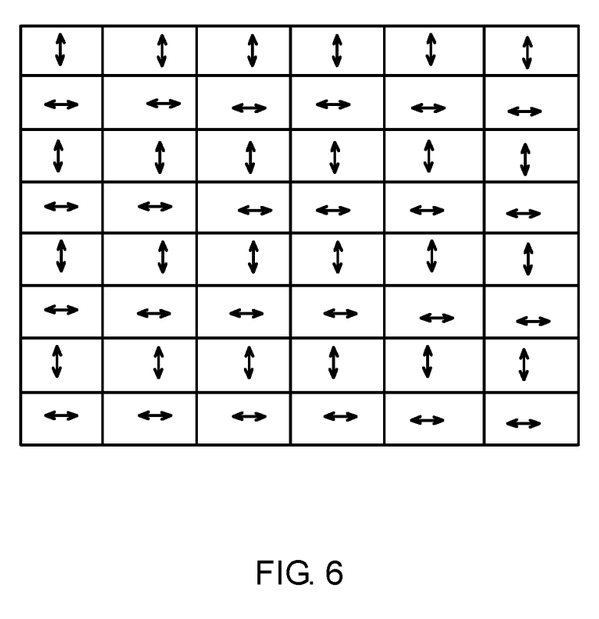
FIG. 6 is a schematic view illustrating, as a top view, an angle of light of each sub-pixel of the 3D display panel of FIG. 1.

Referring to FIGS. 1-6, a 3D (three-dimensional) display panel 100 is applicable to self-luminous display devices, such as organic light-emitting diode (OLED) or quantum dot light emitting diode (QLED). The 3D display panel 10 comprises a base plate 100 and a plurality of pixel units 200 formed on the base plate 100 and arranged in an array. Each of the pixel units 200 comprises at least one sub-pixel 210. Each of the sub-pixels comprises a primary pixel 211 and a secondary pixel 212. The 3D display panel 10 further comprises a first light emission unit 300 and a second light emission unit 500 that are arranged on the same side of the base plate 100 and respectively correspond to the primary pixel 211 and the secondary pixel 212. The first light emission unit 300 is controlled by a first thin-film transistor Q1 and the second light emission unit 500 is controlled by a second thin-film transistor Q2. The first light emission unit 300 comprises a first anode 310, a first hole transportation layer 320, a first orientation layer 330, a first light emissive layer 340, a first electron transportation layer 350, and a first cathode 360 that are arranged on the same side of the base plate 100 and sequentially stacked. The first cathode 310 functions to supply first holes, and the first hole transportation layer 320 transports the first holes to the first light emissive layer 340. The first orientation layer 330 functions to set orientation of the first light emissive layer 340 so that the first light emissive layer 340 is in a first orientation state. The first cathode 360 functions to supply first electrons, and the first electron transportation layer 350 transports the first electrons to the first light emissive layer 340. The first electrons and the first holes are recombined in the first light emissive layer 340 to emit first polarization light. The second light emission unit 500 comprises a second anode 510, a second hole transportation layer 520, a second orientation layer 530, a second light emissive layer 540, a second electron transportation layer 550, and a second cathode 560 that are arranged on the same side of the base plate 100 and sequentially stacked. The second anode 510 functions to supply the second holes, and the second hole transportation layer 520 transports the second holes to the second light emissive layer 540. The second orientation layer 530 functions to set orientation of the second light emissive layer 540 so that the second light emissive layer 540 is in a second orientation state. The second cathode 560 functions to supply second electrons, and the second electron transportation layer 550 transports the second electrons to the second light emissive layer 540. The second electrons and the second holes are recombined in the second light emissive layer 540 to emit second polarization light. The polarization of the first polarization light is orthogonal to the polarization of the second polarization light. Preferably, the first polarization light is vertically polarized light and the second polarization light is horizontally polarized light. In FIGS. 5 and 6, a vertical arrow is used to indicate the first polarization light and a horizontal arrow indicates the second polarization light.

Specifically, the materials that make the first light emissive layer 340 of the first light emission unit 300 and the second light emissive layer 540 of the second light emission unit 500 can be the same or different materials. In the instant embodiment, the first light emissive layer 340 and the second light emissive layer 540 both comprise organic liquid crystal polymer (LCP). The organic LCP possesses the characteristics of liquid crystal molecules and also shows excellent property of light emission and different orientation of the organic LCP can be achieved with orientating techniques. Taking the first orientation layer 330 and the first light emissive layer 340 as an example, orientation of the first light emissive layer 340 by means of the first orientation layer 330 will be described as follows. Firstly, an orientating technique is applied to form the first orientation layer 330 and then, a light emissive material (such as LCP) is formed as a film through spray coating. Afterwards heat is applied to have molecules of the light emissive material aligned in an orientation direction on the first orientation layer 330 so as to form, after drying, a film that serves as the first light emissive layer 340. It an be appreciated that orientation of the second light emissive layer 540 by means of the second orientation layer 530 is similar to the orientation of the first light emissive layer 340 by the first orientation layer 330 and thus, no repeated description will be given here. The first light emission unit 300 and the second light emission unit 500 meet at least one of the following conditions: (1) the first anode 310 and the second anode 510 being arranged on the same layer; (2) the first hole transportation layer 320 and the second hole transportation layer 520 being arranged on the same layer; (3) the first orientation layer 330 and the second orientation layer 530 being arranged on the same layer; (4) the first light emissive layer 340 and the second light emissive layer 540 being arranged on the same layer; (5) the first electron transportation layer 350 and the second electron transportation layer 550 being arranged on the same layer; and (6) the first cathode 360 and the second cathode 560 being arranged on the same layer. Preferably, the first light emission unit 300 and the second light emission unit 500 meet at least one of the following conditions: (1) the first anode 310 and the second anode 510 being arranged as a unitary structure, when the first anode 310 and the second anode 510 are arranged on the same layer; (2) the first hole transportation layer 320 and the second hole transportation layer 520 being arranged as a unitary structure, when the first hole transportation layer 320 and the second hole transportation layer 520 are arranged on the same layer; (3) the first orientation layer 330 and the second orientation layer 530 being arranged as a unitary structure, when the first orientation layer 330 and the second orientation layer 530 are arranged on the same layer; (4) the first light emissive layer 340 and the second light emissive layer 540 being arranged as a unitary structure, when the first light emissive layer 340 and the second light emissive layer 540 are arranged on the same layer; (5) the first light emissive layer 340 and the second light emissive layer 540 being arranged as a unitary structure, when the first electron transportation layer 350 and the second electron transportation layer 550 are arranged on the same layer; and (6) the first light emissive layer 340 and the second light emissive layer 540 being arranged as a unitary structure, when the first cathode 360 and the second cathode 560 are arranged on the same layer. When the first light emission unit 300 and the second light emission unit 500 meet any one of the above listed conditions, the manufacturing operation can be simplified.

In the instant embodiment, the base plate 100 is provided on a surface of the first anode 310 that is distant from the first hole transportation layer 320 and is also provided on a surface of the second anode 510 that is distant from the second hole transportation layer 520. The first anode 310 and the second anode 510 are both transparent electrodes, and the first cathode 360 and the second cathode 560 are both metal electrodes. The first polarization light and the second polarization light are projected out from a surface of the base plate 100 that is distant from the first anode 510 and the second anode 520.

In another embodiment, the base plate 100 is provided on a surface of the first cathode 360 that is distant from the first electron transportation layer 350 and is also provided on a surface of the second cathode 560 that is distant from the second electron transportation layer 550. The first cathode 360 and the second cathode 560 are both transparent electrodes, and the first anode 310 and the second anode 510 are both metal electrodes. The first polarization light and the second polarization light are projected out from a surface of the base plate 100 that is distant from the first cathode 360 and the second cathode 560.

In the instant embodiment, the first orientation layer 330 comprises one of poly(3,4-ethylenedioxythiophene):poly styrenesulfonate (PEDOT:PSS), poly(p-phenyl vinyl) (PPV), and polyaniline (PANI) and the second orientation layer 530 comprises one of PEDOT:PSS, PPV, and PANI.

Figure 1:
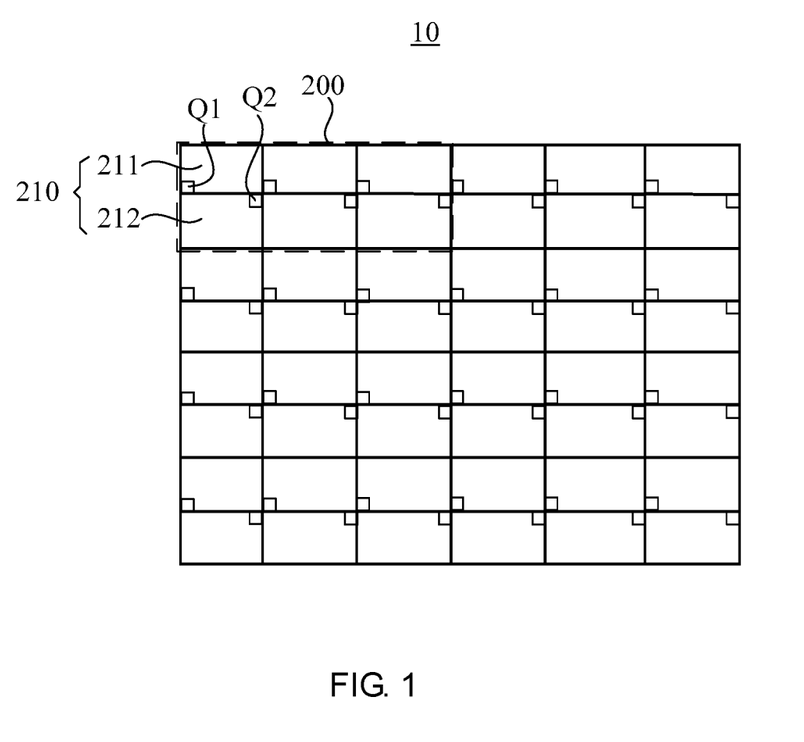
FIG. 1 is a schematic view illustrating a 3D display panel according to a preferred embodiment of the present invention.
Figure 2:
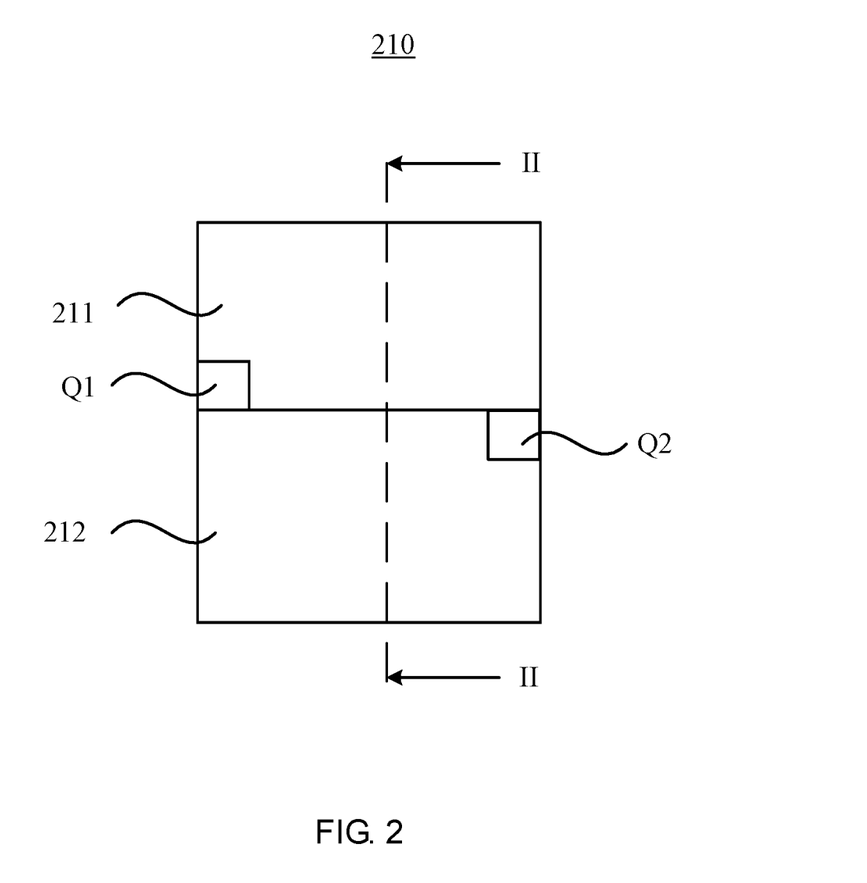
FIG. 2 is a schematic view illustrating the structure of a single sub-pixel of FIG. 1.

Compared to the prior art, the present invention provides a 3D display panel 10, in which each sub-pixel 210 is divided into a primary pixel 211 and a secondary pixel 212 and a first light emission unit 300 that is provided to correspond to the primary pixel 211 and a second light emission unit 500 that is provided to correspond to the secondary pixel 212 divide a display image into first polarization light and second polarization light of which polarizations are orthogonal, which, when used in combination with goggles that are capable of receiving the two types of polarization light, allow a left eye and a right eye to respectively receive different images, allowing human eyes to form, through observation and combination of the images, a stereoscopic image.

Figure 7:
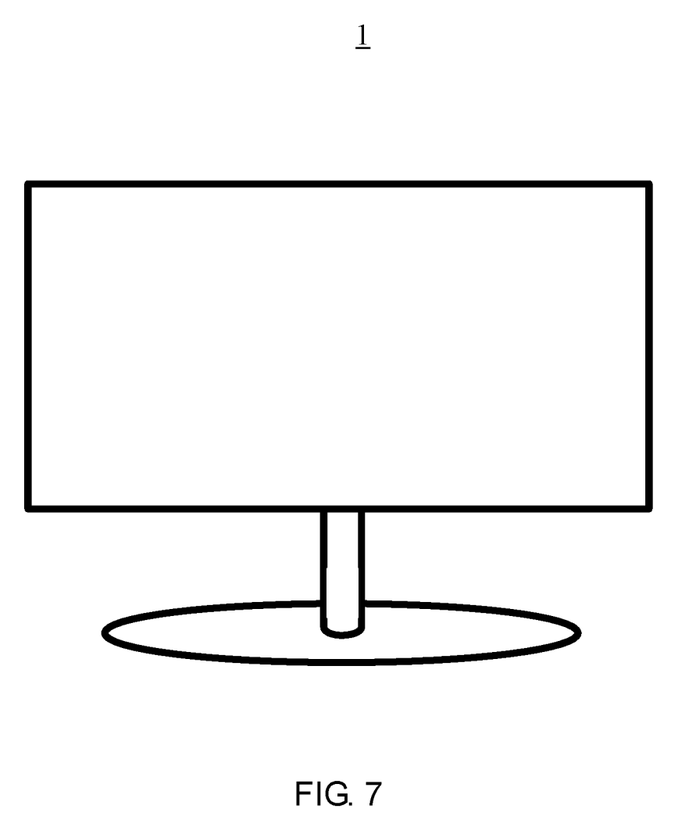
FIG. 7 is a schematic view illustrating a 3D display device according to a preferred embodiment of the present invention.

Referring to FIG. 7, FIG. 7 is a schematic view illustrating a 3D display device according to a preferred embodiment of the present invention. The 3D display device 1 according to the present invention comprises the 3D display panel 10 that has been described previously so that repeated description will be omitted here. The 3D display device 1 is applicable to electronic devices, including, but not limited to, a smart phone, a mobile internet device (MID), an electronic book, a play station portable (PSP), and a personal digital assistant (PDA), and may also function as a display.

The present invention has been described with reference to the preferred embodiments. However, it is noted that those skilled in the art would appreciates that various improvements and modifications are still available without departing from the scope of the present invention and such improvements and modifications are considered within the scope of protection of the present invention.

What is claimed is:

1. A 3D display panel, comprising: a base plate and a plurality of pixel units formed on the base plate and arranged in an array, each of the pixel units comprising at least one sub-pixel, each of the sub-pixels comprising a primary pixel and a secondary pixel; wherein the 3D display panel further comprises a first light emission unit and a second light emission unit that are arranged on the same side of the base plate and respectively correspond to the primary pixel and the secondary pixel, the first light emission unit being controlled by a first thin-film transistor, the second light emission unit being controlled by a second thin-film transistor; the first light emission unit comprises a first anode, a first hole transportation layer, a first orientation layer, a first light emissive layer, a first electron transportation layer, and a first cathode that are arranged on the same side of the base plate and sequentially stacked, the first cathode supplying first holes, the first hole transportation layer transporting the first holes to the first light emissive layer, the first orientation layer setting orientation of the first light emissive layer so that the first light emissive layer is in a first orientation state, the first cathode supplying first electrons, the first electron transportation layer transporting the first electrons to the first light emissive layer, wherein the first electrons and the first holes are recombined in the first light emissive layer to emit first polarization light; and the second light emission unit comprises a second anode, a second hole transportation layer, a second orientation layer, a second light emissive layer, a second electron transportation layer, and a second cathode that are arranged on the same side of the base plate and sequentially stacked, the second anode supplying the second holes, the second hole transportation layer transporting the second holes to the second light emissive layer, the second orientation layer setting orientation of the second light emissive layer so that the second light emissive layer is in a second orientation state, the second cathode supplying second electrons, the second electron transportation layer transporting the second electrons to the second light emissive layer, wherein the second electrons and the second holes are recombined in the second light emissive layer to emit second polarization light, the polarization of the first polarization light being orthogonal to the polarization of the second polarization light.

2. The 3D display panel as claimed in claim 1, wherein the first light emission unit and the second light emission unit satisfy at least one of the following conditions:
the first anode and the second anode being arranged on the same layer;
the first hole transportation layer and the second hole transportation layer being arranged on the same layer;
the first orientation layer and the second orientation layer being arranged on the same layer;
the first light emissive layer and the second light emissive layer being arranged on the same layer;
the first electron transportation layer and the second electron transportation layer being arranged on the same layer; and
the first cathode and the second cathode being arranged on the same layer.

3. The 3D display panel as claimed in claim 2, wherein the first light emission unit and the second light emission unit satisfy at least one of the following conditions:
the first anode and the second anode being arranged as a unitary structure, when the first anode and the second anode are arranged on the same layer;
the first hole transportation layer and the second hole transportation layer being arranged as a unitary structure, when the first hole transportation layer and the second hole transportation layer are arranged on the same layer;
the first orientation layer and the second orientation layer being arranged as a unitary structure, when the first orientation layer and the second orientation layer are arranged on the same layer;
the first light emissive layer and the second light emissive layer being arranged as a unitary structure, when the first light emissive layer and the second light emissive layer are arranged on the same layer;
the first electron transportation layer and the second electron transportation layer being arranged on the same layer, when the first electron transportation layer and the second electron transportation layer are arranged on the same layer; and
the first cathode and the second cathode being arranged as a unitary structure, when the first cathode and the second cathode are arranged on the same layer.

4. The 3D display panel as claimed in claim 1, wherein the base plate is provided on a surface of the first anode that is distant from the first hole transportation layer and is also provided on a surface of the second anode that is distant from the second hole transportation layer.

5. The 3D display panel as claimed in claim 4, wherein the first anode and the second anode are transparent electrodes and the first cathode and the second cathode are metal electrodes; and the first polarization light and the second polarization light are projected out from a surface of the base plate that is distant from the first anode and the second anode.

6. The 3D display panel as claimed in claim 1, wherein the base plate is provided on a surface of the first cathode that is distant from the first electron transportation layer and is provided on a surface of the second cathode that is distant from the second electron transportation layer.

7. The 3D display panel as claimed in claim 6, wherein the first cathode and the second cathode are transparent electrodes and the first anode and the second anode are metal electrodes; and the first polarization light and the second polarization light are projected out from a surface of the base plate that is distant from the first cathode and the second cathode.

8. The 3D display panel as claimed in claim 1, wherein the first light emissive layer and the second light emissive layer comprise organic liquid crystal polymer.

9. The 3D display panel as claimed in claim 1, wherein the first orientation layer comprises one of PEDOT:PSS, PPV, and PANI; and the second orientation layer comprises one of PEDOT:PSS, PPV, and PANI.

10. A 3D display device, comprising a 3D display panel, the 3D display panel comprising: a base plate and a plurality of pixel units formed on the base plate and arranged in an array, each of the pixel units comprising at least one sub-pixel, each of the sub-pixels comprising a primary pixel and a secondary pixel; wherein the 3D display panel further comprises a first light emission unit and a second light emission unit that are arranged on the same side of the base plate and respectively correspond to the primary pixel and the secondary pixel, the first light emission unit being controlled by a first thin-film transistor, the second light emission unit being controlled by a second thin-film transistor; the first light emission unit comprises a first anode, a first hole transportation layer, a first orientation layer, a first light emissive layer, a first electron transportation layer, and a first cathode that are arranged on the same side of the base plate and sequentially stacked, the first cathode supplying first holes, the first hole transportation layer transporting the first holes to the first light emissive layer, the first orientation layer setting orientation of the first light emissive layer so that the first light emissive layer is in a first orientation state, the first cathode supplying first electrons, the first electron transportation layer transporting the first electrons to the first light emissive layer, wherein the first electrons and the first holes are recombined in the first light emissive layer to emit first polarization light; and the second light emission unit comprises a second anode, a second hole transportation layer, a second orientation layer, a second light emissive layer, a second electron transportation layer, and a second cathode that are arranged on the same side of the base plate and sequentially stacked, the second anode supplying the second holes, the second hole transportation layer transporting the second holes to the second light emissive layer, the second orientation layer setting orientation of the second light emissive layer so that the second light emissive layer is in a second orientation state, the second cathode supplying second electrons, the second electron transportation layer transporting the second electrons to the second light emissive layer, wherein the second electrons and the second holes are recombined in the second light emissive layer to emit second polarization light, the polarization of the first polarization light being orthogonal to the polarization of the second polarization light.

11. The 3D display device as claimed in claim 10, wherein the first light emission unit and the second light emission unit satisfy at least one of the following conditions:
the first anode and the second anode being arranged on the same layer;
the first hole transportation layer and the second hole transportation layer being arranged on the same layer;
the first orientation layer and the second orientation layer being arranged on the same layer;
the first light emissive layer and the second light emissive layer being arranged on the same layer;
the first electron transportation layer and the second electron transportation layer being arranged on the same layer; and
the first cathode and the second cathode being arranged on the same layer.

12. The 3D display device as claimed in claim 11, wherein the first light emission unit and the second light emission unit satisfy at least one of the following conditions:
the first anode and the second anode being arranged as a unitary structure, when the first anode and the second anode are arranged on the same layer;
the first hole transportation layer and the second hole transportation layer being arranged as a unitary structure, when the first hole transportation layer and the second hole transportation layer are arranged on the same layer;
the first orientation layer and the second orientation layer being arranged as a unitary structure, when the first orientation layer and the second orientation layer are arranged on the same layer;
the first light emissive layer and the second light emissive layer being arranged as a unitary structure, when the first light emissive layer and the second light emissive layer are arranged on the same layer;
the first electron transportation layer and the second electron transportation layer being arranged on the same layer, when the first electron transportation layer and the second electron transportation layer are arranged on the same layer; and
the first cathode and the second cathode being arranged as a unitary structure, when the first cathode and the second cathode are arranged on the same layer.

13. The 3D display device as claimed in claim 10, wherein the base plate is provided on a surface of the first anode that is distant from the first hole transportation layer and is also provided on a surface of the second anode that is distant from the second hole transportation layer.

14. The 3D display device as claimed in claim 13, wherein the first anode and the second anode are transparent electrodes and the first cathode and the second cathode are metal electrodes; and the first polarization light and the second polarization light are projected out from a surface of the base plate that is distant from the first anode and the second anode.

15. The 3D display device as claimed in claim 10, wherein the base plate is provided on a surface of the first cathode that is distant from the first electron transportation layer and is provided on a surface of the second cathode that is distant from the second electron transportation layer.

16. The 3D display device as claimed in claim 15, wherein the first cathode and the second cathode are transparent electrodes and the first anode and the second anode are metal electrodes; and the first polarization light and the second polarization light are projected out from a surface of the base plate that is distant from the first cathode and the second cathode.

17. The 3D display device as claimed in claim 10, wherein the first light emissive layer and the second light emissive layer comprise organic liquid crystal polymer.

18. The 3D display device as claimed in claim 10, wherein the first orientation layer comprises one of PEDOT:PSS, PPV, and PANI; and the second orientation layer comprises one of PEDOT:PSS, PPV, and PANI.

* * * * *